United States Patent
Wang et al.

(10) Patent No.: US 9,685,632 B2
(45) Date of Patent: Jun. 20, 2017

(54) ENCAPSULATING STRUCTURE, THE ELECTRONICAL PACKAGE DEVICE AND DISPLAY APPARATUS THAT INCORPORATES IT

(71) Applicant: BOE Technology Group Co., Ltd., Beijing (CN)

(72) Inventors: Tao Wang, Beijing (CN); Weifeng Zhou, Beijing (CN); Song Zhang, Beijing (CN); Tao Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/777,774

(22) PCT Filed: Jan. 22, 2015

(86) PCT No.: PCT/CN2015/071328
§ 371 (c)(1),
(2) Date: Sep. 17, 2015

(87) PCT Pub. No.: WO2016/045279
PCT Pub. Date: Mar. 31, 2016

(65) Prior Publication Data
US 2016/0301032 A1   Oct. 13, 2016

(30) Foreign Application Priority Data

Sep. 26, 2014 (CN) .......................... 2014 1 0505861

(51) Int. Cl.
*H01L 51/52* (2006.01)
*H01L 51/00* (2006.01)

(52) U.S. Cl.
CPC ...... *H01L 51/5256* (2013.01); *H01L 51/0034* (2013.01); *H01L 51/0043* (2013.01);
(Continued)

(58) Field of Classification Search
CPC ............ H01L 51/5256; H01L 51/0034; H01L 51/0043; H01L 51/52; H01L 2251/303;
(Continued)

(56) References Cited

U.S. PATENT DOCUMENTS

| 6,268,695 B1 | 7/2001 | Affinito |
| 6,413,645 B1 | 7/2002 | Graff et al. |

(Continued)

FOREIGN PATENT DOCUMENTS

| CN | 101351332 A | 1/2009 |
| CN | 101752500 A | 6/2010 |

(Continued)

OTHER PUBLICATIONS

Hozumi et al., Chinese Patent Application Publication CN101351332, Jan. 2009, machine translation.*

(Continued)

*Primary Examiner* — Tracie Y Green
(74) *Attorney, Agent, or Firm* — Westman, Champlin & Koehler, P.A.

(57) ABSTRACT

This present disclosure provides an encapsulating layer, an electronic package device and a display apparatus, relates to the field of electronics technology, and may decrease the thickness of the encapsulating layer, thereby achieving lightening and thinning of the electronic package device. The encapsulating layer comprises an encapsulating barrier layer and an organic coating layer directly formed on the encapsulating barrier layer; wherein the organic coating layer is a polymerizable organic coating layer; and the polymerizable organic coating layer comprises an unsaturated acrylate organic coating layer. The encapsulating layer is used for encapsulating an electronic device.

13 Claims, 2 Drawing Sheets

(52) U.S. Cl.
CPC .. *H01L 2251/301* (2013.01); *H01L 2251/303* (2013.01); *H01L 2251/5338* (2013.01); *H01L 2251/558* (2013.01)

(58) Field of Classification Search
CPC ....... H01L 2251/5338; H01L 2251/558; H01L 2251/30
See application file for complete search history.

(56) References Cited

U.S. PATENT DOCUMENTS

| | | | |
|---|---|---|---|
| 2012/0001217 A1* | 1/2012 | Kang | C08L 81/02 257/98 |
| 2014/0091290 A1 | 4/2014 | Li et al. | |
| 2014/0179040 A1 | 6/2014 | Ramadas et al. | |
| 2016/0254489 A1* | 9/2016 | Sun | H01L 51/56 257/40 |
| 2016/0336356 A1* | 11/2016 | Sun | G06F 1/1652 |
| 2017/0040572 A1* | 2/2017 | Gao | H01L 51/5256 |
| 2017/0049394 A1* | 2/2017 | Zhang | A61B 5/6807 |

FOREIGN PATENT DOCUMENTS

| | | |
|---|---|---|
| CN | 102057750 A | 5/2011 |
| CN | 102299123 A | 12/2011 |
| CN | 102651456 A | 8/2012 |
| WO | 2014/013716 A1 | 1/2014 |
| WO | 2014/017396 A1 | 1/2014 |

OTHER PUBLICATIONS

CN102299123 , Chinese Patent Application publication CN102299123, Dec. 2011, machine translation.*
https://en.wikipedia.org/wiki/Thin_film, May 2005.*
First Office Action, including Search Report, for Chinese Patent Application No. 201410505861.5, dated May 3, 2016, 12 pages.
International Search Report and Written Opinion for PCT Application No. PCT/CN2015/071328; dated Jul. 7, 2015; 9 pages.
English translation of Box No. V of the Written Opinion for the International Searching Authority for PCT Application No. PCT/CN2015/071328; 2 pages.
Second Office Action for Chinese Patent Application No. 201410505861.5, dated Nov. 9, 2016, 10 pages.
Rejection Decision for Chinese Patent Application No. 201410505861.5, dated Mar. 20, 2017, 12 pages.

* cited by examiner

US 9,685,632 B2

ENCAPSULATING STRUCTURE, THE ELECTRONICAL PACKAGE DEVICE AND DISPLAY APPARATUS THAT INCORPORATES IT

CROSS-REFERENCE TO RELATED APPLICATIONS

This application is a Section 371 National Stage Application of International Application No. PCT/CN2015/071328, filed 22 Jan. 2015, entitled "ENCAPSULATING LAYER, ELECTRONIC PACKAGE DEVICE AND DISPLAY APPARATUS", which has not yet published, which claims priority to Chinese Application No. 201410505861.5, filed on 26 Sep. 2014, incorporated herein by reference in their entirety.

FIELD OF THE INVENTION

This disclosure relates to the field of electronics technology, particularly to an encapsulating layer, an electronic package device and a display apparatus.

BACKGROUND OF THE INVENTION

A number of electronic devices, such as OLED (Organic Light Emitting Diode, or organic electroluminescence device) or CCD (Charge-coupled Device), are sensitive to moisture and oxygen in the atmospheric environment. In order to ensure the normal operation of the electronic devices, encapsulations of the electronic devices are needed to prevent them from moisture and oxygen in the atmospheric environment, thereby elongate the useful life thereof.

By exemplifying an OLED display device, as shown in FIG. 1 (a) and FIG. 1 (b), the OLED display device may be encapsulated in a manner of the combination of an inorganic passivating layer 301 and a water-oxygen barrier membrane 303 or an encapsulating thin film 302 and a water-oxygen barrier membrane 303, in the prior art. Here, the water-oxygen barrier membrane 303 is typically prepared by the extrusion molding process with a polymer material; bound by the process of preparation, only if the thickness of the water-oxygen barrier membrane 303 is controlled to about 50 μm, the uniformity thereof can be ensured. On this basis, adhesion by a binder is further required between the inorganic passivating layer 301 and the water-oxygen barrier membrane 303 or between the encapsulating thin film 302 and the water-oxygen barrier membrane 303 so as to lead to further increase of the thickness of the encapsulating layer 30.

It thus can be known that the fact that the adhesion of a water-oxygen barrier membrane 303 to an inorganic passivating layer 301 or an encapsulating thin film 302 in a manner of a binder is used in the prior packaging technology does not contribute to the achievement of lightening and thinning of electronic devices.

SUMMARY OR THE INVENTION

This present disclosure provides an encapsulating layer, an electronic package device and a display apparatus, and may decrease the thickness of the encapsulating layer, thereby achieving lightening and thinning of the electronic package device.

To achieve the object described above, the embodiments of this disclosure employ the following technical solutions:

In an embodiment, the disclosure provides an encapsulating layer, which comprises an encapsulating barrier layer and an organic coating layer directly formed on the encapsulating barrier layer; wherein the organic coating layer is a polymerizable organic coating layer.

In an embodiment, the polymerizable organic coating layer comprises an unsaturated acrylate organic coating layer.

In an embodiment, the organic coating layer has a thickness of 2.5 μm-10 μm.

In an embodiment, the unsaturated acrylate organic coating layer comprises a polyurethane acrylate organic coating layer or an epoxy acrylate organic coating layer.

In an embodiment, the unsaturated acrylate organic coating layer is added with a cationic surfactant; wherein the cationic surfactant comprises a hydrophilic quaternary ammonium salt.

In an embodiment, the unsaturated acrylate organic coating layer comprises a first coating layer adjacent to the encapsulating barrier layer and a second coating layer away from the encapsulating barrier layer; wherein the first coating layer has a refractive index greater than that of the second coating layer.

In an embodiment, the first coating layer comprises one or more of a silane modified unsaturated acrylate polymer, an unsaturated polyurethane acrylate polymer, and an unsaturated fluorine-containing acrylate polymer; the second coating layer comprises an unsaturated acrylate polymer doped with inorganic particles; the inorganic particles include one or more of titanium dioxide particles, titanium monoxide particles, zinc oxide particles, copper calcium titanate particles, and strontium titanate particles.

In an embodiment, the unsaturated acrylate organic coating layer comprises an unsaturated acrylate organic coating layer doped with hard particles; wherein the hard particles include one or more of graphene oxide, transparent graphite, glass fiber, and diamond particles.

In an embodiment, the encapsulating barrier layer comprises a plurality of overlapped encapsulating thin films.

In an embodiment, the encapsulating barrier layer is a silicon nitride thin film or alternately deposited organic thin films and inorganic thin films.

In an embodiment, the organic coating layer is an organic coating layer formed by forming an organic solution coating layer on the encapsulating barrier layer through spin coating, spray coating, blade coating, inkjet printing or slit coating, and then subjecting the organic solution coating layer to ultraviolet light curing, visible light curing, thermal curing, or chemical decomposition curing.

In an embodiment, the encapsulating barrier layer has a thickness of 0.9-1.1 μm.

In an embodiment, the disclosure provides an electronic package device, which comprises a base substrate and an encapsulating layer, as well as an electronic device located therebetween; the encapsulating layer is the encapsulating layer described above.

In an embodiment, the electronic package device is an OLED display device, and the electronic device is an organic material functional layer between the base substrate and the encapsulating layer; wherein the encapsulating barrier layer of the encapsulating layer is adjacent to the base substrate, and the organic coating layer of the encapsulating layer is away from the base substrate.

In an embodiment, the base substrate is a flexible base substrate; wherein the flexible base substrate includes any one of a polyimide base substrate, a polyethylene base substrate, a polypropylene base substrate, a polystyrene base substrate, a polyethylene terephthalate base substrate, and a polyethylene naphthalate base substrate.

In an embodiment, the disclosure provides a display apparatus, which comprises the electronic package device described above.

The embodiments of this disclosure provide an encapsulating layer, an electronic package device and a display apparatus. The encapsulating layer comprises an encapsulating barrier layer and an organic coating layer directly formed on the encapsulating barrier layer; wherein the organic coating layer is a polymerizable organic coating layer; and the polymerizable organic coating layer comprises an unsaturated acrylate organic coating layer.

On this basis, the encapsulating layer provided by an embodiment of this disclosure may consist of both the encapsulating barrier layer and the organic coating layer; wherein, the encapsulating barrier layer has a certain function of water and oxygen barrier, and the organic coating layer may further improve the effect of water and oxygen barrier. On this basis, when the organic coating layer is used for replacing the water-oxygen barrier membrane, combination may be achieved without using the binder between them, and the organic coating layer has a thickness which is significantly less than that of the water-oxygen barrier membrane. Therefore, in the case of ensuring the effect of water and oxygen barrier of the encapsulating layer, the thickness of the encapsulating layer is allowed to be significantly reduced, thereby achieving lightening and thinning of the electronic package device.

BRIEF DESCRIPTION OF THE DRAWINGS

In order to illustrate the technical solutions in embodiments of this present disclosure or in the prior art more clearly, figures required for describing the embodiments or the prior art will be simply introduced below. It is apparent that the figures described below are merely some embodiments of this disclosure, and other figures may be further obtained by ordinary skilled person in the art according to these figures without exerting inventive work.

REFERENCE NUMERALS

10—a (flexible) base substrate; 20—an electronic device/organic material functional layer; 30—an encapsulating layer; 301—an inorganic passivating layer; 302—an encapsulating thin film; 303—a water-oxygen barrier membrane; 304—an encapsulating barrier layer; 305—an organic coating layer; 40—a thin-film transistor.

DETAILED DESCRIPTION OF THE INVENTION

The technical solutions in the examples of this disclosure will be described clearly and fully below in conjunction with accompanying drawings in examples of this disclosure. Obviously, the examples described are merely part of the examples of this disclosure, rather than all of the examples. Based on the examples in this disclosure, all other examples obtained by those of ordinary skill in the art without performing inventive work belong to the scope protected by this disclosure.

Figure 2:
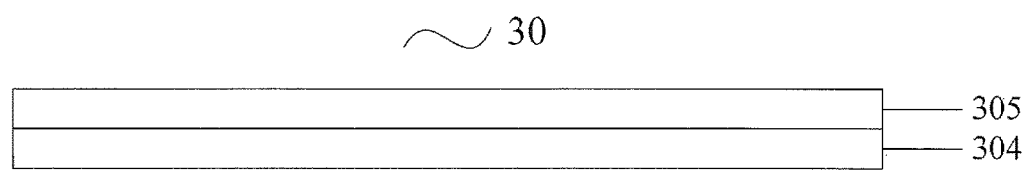
FIG. 2 is a structural schematic diagram of an encapsulating layer provided by an example of this disclosure.

An example of this disclosure provides an encapsulating layer 30, as shown in FIG. 2, which comprises an encapsulating barrier layer 304 and an organic coating layer 305 directly formed on the encapsulating barrier layer 304; wherein the organic coating layer 305 is a polymerizable organic coating layer, and the polymerizable organic coating layer may comprise an unsaturated acrylate organic coating layer.

Figure 1:
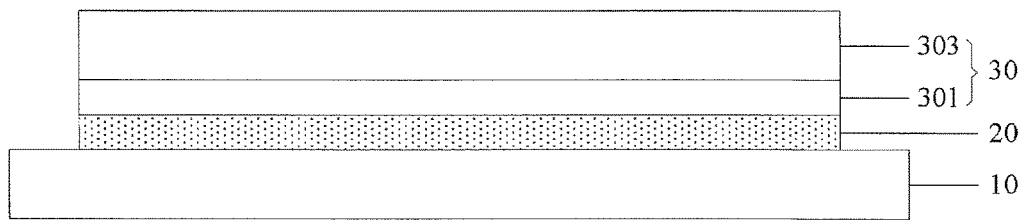
FIGS. 1 (a) and 1 (b) is each a structural schematic diagram of an OLED display device in the prior art.
Figure 1:
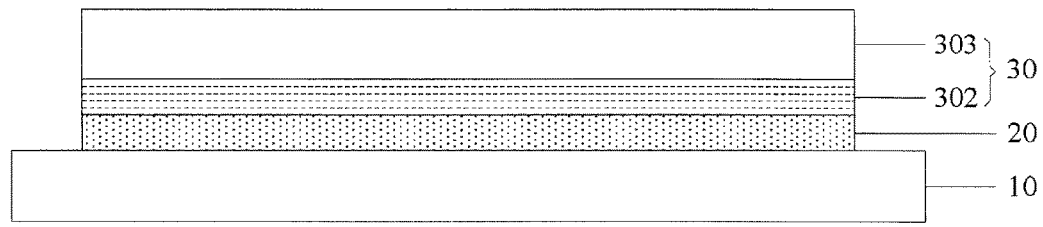

It is to be indicated as follows. Firstly, the encapsulating barrier layer 304 may employ the inorganic passivating layer 301 shown in FIG. 1, for example a silicon nitride thin film. Alternatively, the encapsulating barrier layer 304 may also employ the encapsulating thin film 302 shown in FIG. 2, for example alternately deposited organic thin films and inorganic thin films.

Secondly, the forming of the organic coating layer 305 may comprise the two stages of organic solution application and film-forming by curing; wherein, the means for organic solution application may include any one of spin coating, spray coating, blade coating, inkjet printing, and slit coating; and the means for film-forming by curing may include any one of ultraviolet light curing, visible light curing, thermal curing, and chemical decomposition curing.

Thirdly, the encapsulating layer 30 provided by an example of this disclosure is mainly used for encapsulating electronic devices, and therefore the encapsulating layer 30 is required to be formed on a specific base material surface; wherein, the base material surface may be specifically a surface of an electronic device required to be encapsulated.

An example of this disclosure provides an encapsulating layer 30, which comprises an encapsulating barrier layer 304 and an organic coating layer 305 directly formed on the encapsulating barrier layer 304; wherein, the organic coating layer 305 is a polymerizable organic coating layer, and the polymerizable organic coating layer comprises an unsaturated acrylate organic coating layer.

On this basis, the encapsulating layer 30 provided by an example of this disclosure may consist of both the encapsulating barrier layer 304 and the organic coating layer 305; wherein, the encapsulating barrier layer 304 has a certain function of water and oxygen barrier, and the organic coating layer 305 may further improve the effect of water and oxygen barrier. On this basis, when the organic coating layer 305 is used for replacing the water-oxygen barrier membrane 303, combination may be achieved without using the binder between them, and the organic coating layer 305 has a thickness which is significantly less than that of the water-oxygen barrier membrane 303. Therefore, in the case of ensuring the effect of water and oxygen barrier of the encapsulating layer 30, the thickness of the encapsulating layer 30 is allowed to be significantly reduced, thereby achieving lightening and thinning of the electronic package device.

Based on the above description, the encapsulating barrier layer 304 may employ the inorganic passivating layer 301 or the encapsulating thin film 302, and has a thickness of about 1 μm; and the organic coating layer 305 preferably employs an unsaturated acrylate organic coating layer, and has a thickness which may be up to 1-10 μm, preferably 2.5-10 μm, more preferably 5-7.5 μm.

Here, the encapsulating barrier layer 304 preferably employs a plurality of overlapped encapsulating thin films 302, for example alternately deposited organic thin films and inorganic thin films. Compared to the inorganic passivating layer 301, the encapsulating thin film 302 has a better effect of water and oxygen barrier.

Particularly, the unsaturated acrylate organic coating layer may specifically include a polyurethane acrylate organic coating layer or an epoxy acrylate organic coating layer.

The unsaturated acrylate may be selected from the unsaturated acrylates used for forming film layers when curing by means of ultraviolet light, visible light, heat, chemical reaction or the like, and specific examples thereof include: hydroxyethyl acrylate, amino acrylates, epoxy acrylates, alicyclic epoxy methacrylic acid esters, methyl methacrylate, or the like. Preferably, the unsaturated acrylate is a urethane acrylate or an epoxy acrylate. The urethane acrylate may be selected from one or more of the group consisting of carbamate acrylates, organosilicon-acrylate modified polyurethanes, epoxy modified urethane acrylates, aliphatic modified urethane acrylates, or the like. The epoxy acrylate may be a bisphenol A epoxy acrylate. In order to achieve full crosslinking to avoid the binder to be used and for the purpose of providing a sufficient function of water and oxygen barrier, the unsaturated acrylate has a weight average molecular weight of 5000-100000, preferably 10000-50000, and more preferably 10000-25000.

In addition, the organic coating layer in the encapsulating layer according to the disclosure may further contain various functional auxiliaries, for example, an anti-fogging agent, an anti-reflecting agent, a scratch-resisting agent or the like, and the contents thereof in the organic coating layer may be appropriately selected according to desired properties. The organic coating layer may be an organic coating layer doped with anti-fogging particles or a surfactant, or may be a water-absorbent type anti-fogging organic coating layer. The anti-fogging particles to be doped include: titanium dioxide, zinc oxide, nano-silica, ultra-hydrophobic silicon materials, cation/anion/amphoteric surfactants, modified polymers, or the like; and the water-absorbent type organic coating layer includes polyol polyurethane resins having high water absorbability, or the like. The anti-reflecting function realizes anti-reflection by adding particles having different refractive indices, and the coating layer having a low refractive index realizes low reflection mainly by adding one or more of low-refracting fluorides, fluorine-containing acrylates, silane modified unsaturated acrylate polymers, unsaturated polyurethane acrylate polymers, unsaturated fluorine-containing acrylate polymers; and the coating layer having a high refractive index realizes high refraction generally by adding one or more of inorganic nanoscale oxides, such as titanium dioxide, titanium monoxide, needle-like zinc oxide, nanoscale copper calcium titanate, strontium titanate, to a photocurable acrylate or epoxy coating layer. The scratch resistance may be enhanced by adding scratch-resistant hard particles to the organic coating layer or forming a film through mixing with a hard monomer. For example, the scratch-resisting agent is selected from one or more of glass fiber, celluloses, silicon dioxide particles or silicon-containing particles, aluminum oxide particles, graphene oxide, transparent graphite, glass fiber, and diamond particles. On this basis, by adding specific materials to the unsaturated acrylate organic coating layer, in the case of having the function of water and oxygen barrier, the organic coating layer 305 may be allowed to possess other properties as well, for example anti-fogging property, anti-reflecting property, scratch resistance, or the like.

In an embodiment, the unsaturated acrylate organic coating layer may be added with a cationic surfactant. The cationic surfactant may be selected from one or more of the group consisting of an alkylbenzenesulfonic acid, an alkyl betaine, alanine, a fatty alkane sulphonate, and other polyol fatty acid salts, or the like.

Preferably, the cationic surfactant includes a hydrophilic quaternary ammonium salt. The hydrophilic quaternary ammonium salt is selected from long-chain quaternary ammonium salts containing a curable double-bond structure, such as bromoalkane ethyl acrylates.

Ultraviolet photopolymerizable quaternary ammonium salts may be preferably used as the hydrophilic quaternary ammonium salts. These quaternary ammonium salts may be subject to a reaction by adding bromoalkanes having different chain lengths and an acrylate, and low molecular weight quaternary ammonium salts having different chain lengths may be obtained.

On this basis, by adding the cationic surfactant to the unsaturated acrylate organic coating layer, the wettability of an organic solution to the base material surface may be effectively improved, and the organic solution is capable of spreading on the base material surface, thereby eliminating diffuse reflection of light rays and achieving the anti-fogging effect.

It is to be indicated that in order to achieve the anti-fogging function of the encapsulating layer 30, the material to be added to the unsaturated acrylate organic coating layer is not limited to the cationic surfactants and it may also be other ultra-hydrophilic materials, or ultra-hydrophobic materials, or amphipathic materials.

In an embodiment, the unsaturated acrylate organic coating layer may comprise a first coating layer adjacent to the encapsulating barrier layer 304 and a second coating layer away from the encapsulating barrier layer 304; wherein the first coating layer has a refractive index greater than that of the second coating layer.

The first coating layer may comprise one or more of a silane modified unsaturated acrylate polymer, an unsaturated polyurethane acrylate polymer, an unsaturated fluorine-containing acrylate polymer; wherein the various polymers described above may be a monofunctional polymer or a polyfunctional polymer, which are not defined herein. The first coating layer has a thickness of 1-10 μm, preferably 2.5-10 μm, and more preferably 2.5-7.5 μm.

The second coating layer may comprise an unsaturated acrylate polymer doped with inorganic particles; and particularly, the material of the second coating layer may be the same as or different from that of the first coating layer, and the second coating layer may be allowed to have a relatively high refractive power by adding the inorganic particles to the material of the second coating layer. The inorganic particles may include one or more of titanium dioxide, titanium monoxide, needle-like zinc oxide, nanoscale copper calcium titanate, and strontium titanate. The second coating layer has a thickness of 1-10 μm, preferably 2.5-10 μm, and more preferably 2.5-7.5 μm. In order to obtain the above technical effect that the second coating layer is allowed to have a relatively high refractive power, the particle size of the inorganic particles is preferably 20-1000 nm, more preferably 30-500 nm and most preferably 50-250 nm.

On this basis, by designing the unsaturated acrylate organic coating layer as two coating layers having a high refractive index and a low refractive index respectively, the encapsulating layer 30 may have an improved light-reflecting effect, and is allowed to have a low reflectivity or an anti-reflecting property.

In an embodiment, the unsaturated acrylate organic coating layer may further comprise an unsaturated acrylate organic coating layer doped with hard particles; wherein, the hard particles may specifically include one or more of graphene oxide, transparent graphite, glass fiber, and diamond particles.

Here, the hard particle has a relatively high hardness, and the scratch resistance of the encapsulating layer 30 may be effectively improved by doping the hard particles described above into the unsaturated acrylate organic coating layer.

Specifically, the organic coating layer used for the encapsulating layer according to the disclosure may be prepared from the following composition, which comprises an unsaturated acrylate, an additive and a solvent. The unsaturated acrylate is preferably a urethane acrylate or an epoxy acrylate. Based on the total weight of the composition, the content of the unsaturated acrylate is 10-85% by weight, preferably 20-60% by weight, more preferably 20-40% by weight.

The unsaturated acrylate may be selected from the unsaturated acrylates used for forming film layers when curing by means of ultraviolet light, visible light, heat, chemical reaction or the like, and specific examples thereof include: hydroxyethyl acrylate, amino acrylates, epoxy acrylates, alicyclic epoxy methacrylic acid esters, methyl methacrylate, or the like. Preferably, the unsaturated acrylate is a urethane acrylate or an epoxy acrylate. The urethane acrylate may be selected from one or more of the group consisting of carbamate acrylates, organosilicon-acrylate modified polyurethanes, epoxy modified urethane acrylates, aliphatic modified urethane acrylates, or the like. The epoxy acrylate may be a bisphenol A epoxy acrylate. In order to achieve full crosslinking to avoid the binder to be used and for the purpose of providing a sufficient function of water and oxygen barrier, the unsaturated acrylate has a weight average molecular weight of 5000-100000, preferably 10000-50000, and more preferably 10000-25000.

Figure 3:
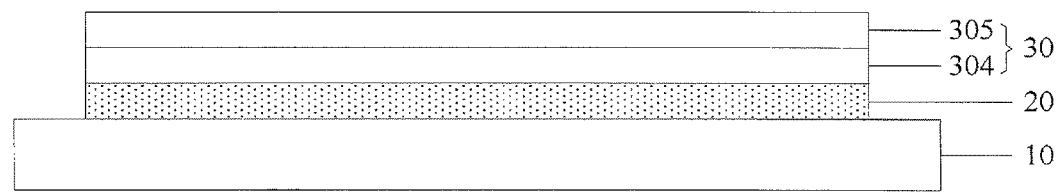
FIG. 3 is a first structural schematic diagram of an electronic package device (OLED display device) provided by an example of this disclosure.

In addition, the organic coating layer in the encapsulating layer according to the disclosure may further contain various functional auxiliaries, for example, an anti-fogging agent, an anti-reflecting agent, a scratch-resisting agent or the like, and the contents thereof in the organic coating layer may be appropriately selected according to desired properties. The organic coating layer may be an organic coating layer doped with anti-fogging particles or a surfactant, or may be a water-absorbent type anti-fogging organic coating layer. The anti-fogging particles to be doped include: titanium dioxide, zinc oxide, nano-silica, ultra-hydrophobic silicon materials, cation/anion/amphoteric surfactants, modified polymers, or the like; and the water-absorbent type organic coating layer includes polyol polyurethane resins having high water absorbability, or the like. The anti-reflecting function realizes anti-reflection by adding particles having different refractive indices, and the coating layer having a low refractive index realizes low reflection mainly by adding one or more of low-refracting fluorides, fluorine-containing acrylates, silane modified unsaturated acrylate polymers, unsaturated polyurethane acrylate polymers, unsaturated fluorine-containing acrylate polymers; and the coating layer having a high refractive index realizes high refraction generally by adding one or more of inorganic nanoscale oxides, such as titanium dioxide, titanium monoxide, needle-like zinc oxide, nanoscale copper calcium titanate, strontium titanate, to a photocurable acrylate or epoxy coating layer. The scratch resistance may be enhanced by adding scratch-resistant hard particles to the organic coating layer or forming a film through mixing with a hard monomer. For example, the scratch-resisting agent is selected from one or more of glass fiber, celluloses, silicon dioxide particles or silicon-containing particles, aluminum oxide particles, graphene oxide particles, transparent graphite particles, glass fiber, and diamond particles. On this basis, by adding specific materials to the unsaturated acrylate organic coating layer, in the case of having the function of water and oxygen barrier, the organic coating layer 305 may be allowed to possess other properties as well, for example anti-fogging property, anti-reflecting property, scratch resistance, or the like The examples of this disclosure further provides an electronic package device, as shown in FIG. 3, which comprises a base substrate 10 and an encapsulating layer 30, as well as an electronic device 20 located therebetween; the encapsulating layer 30 is the encapsulating layer provided by the examples described above.

Particularly, the electronic package device may include OLED display devices, CCD devices, electronic papers, smart tags and smart cards, but is not limited thereto.

Since the key member (i.e., the electronic device 20) of the electronic package device is sensitive to moisture and oxygen in the atmospheric environment, in order to ensure the normal operation of the electronic device 20, the encapsulation thereof is required so as to elongate the useful life thereof.

On this basis, by encapsulating the electronic device 20 using the encapsulating layer 30 provided by the examples of this disclosure, not only the its good effect of water and oxygen bather may be ensured, but also lightening and thinning of the electronic device may be achieved.

On this basis, with reference to the contents shown in FIG. 3, the electronic package device may be an OLED display device, and the electronic device 20 may be an organic material functional layer 20 between the base substrate 10 and the encapsulating layer 30; wherein the encapsulating barrier layer 304 of the encapsulating layer 30 is adjacent to the base substrate 10, and the organic coating layer 305 of the encapsulating layer 30 is away from the base substrate 10.

It is to be indicated as follows. Firstly, in the case where the electronic package device is an OLED display device, a glass substrate or a flexible base substrate may be used as the base substrate 10, which is not specifically defined herein.

Figure 4:
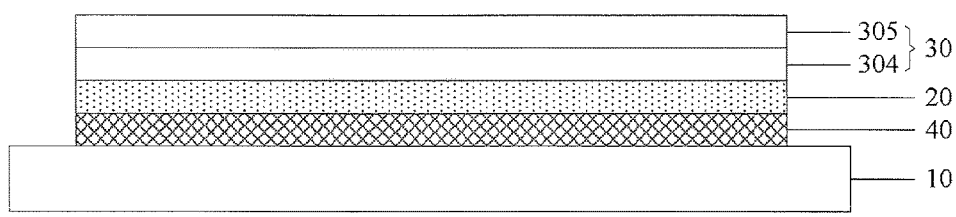
FIG. 4 is a second structural schematic diagram of an electronic package device (OLED display device) provided by an example of this disclosure.

Secondly, the OLED display device may be divided into a passively driven OLED display device shown in FIG. 3 and an actively driven OLED display device shown in FIG. 4. Here, in the case where the driving manner of the OLED display device is active driving, the OLED display device may further comprise a thin-film transistor 40 located between the base substrate 10 and the organic material functional layer 20, used for driving each light emitting units of the OLED display device.

Thirdly, in the process of forming the encapsulating layer 30, the encapsulating barrier layer 304 may be formed on the organic material functional layer 20, and the organic coating layer 305 may be formed on the surface of the encapsulating barrier layer 304. Here, the encapsulating barrier layer 304 may comprise the inorganic passivating layer 301 or the encapsulating thin film 302.

By depositing an encapsulating bather layer 304 on the surface of the organic material functional layer 20 and coating an organic coating layer 305 which is film-formed by curing on the surface of the encapsulating barrier layer 304, the OLED display device provided by the examples of this disclosure may effectively decrease the thickness of the OLED display device and thereby lightening and thinning of the OLED display device is achieved, in the case of ensuring the effect of water and oxygen barrier of the encapsulating layer 30.

Based on the above description, the encapsulating barrier layer 304 preferably employs a plurality of overlapped encapsulating thin films 302, for example alternately deposited organic thin films and inorganic thin films.

Here, compared to the inorganic passivating layer 301, the encapsulating thin film 302 has a better effect of water and oxygen barrier.

On this basis, a flexible base substrate is preferably used as the base substrate 10; wherein, the flexible base substrate 10 may include any one of a polyimide (simply referred to as PI) base substrate, a polyethylene (simply referred to as PE) base substrate, a polypropylene base (simply referred to as PP) substrate, a polystyrene (simply referred to as PS) base substrate, a polyethylene terephthalate (simply referred to as PET) base substrate, and a polyethylene naphthalate (simply referred to as PEN) base substrate.

In this way, the OLED display device is a flexible OLED display device.

On this basis, when the encapsulating layer 30 is used in a flexible OLED display device, the decrease of the thickness of the device may effectively reduce internal stress of the flexible OLED display device so that the bad phenomena of the occurrence of bending cracks and layer separation are ameliorated, and the bending property of the OLED display device is improved.

Here, the OLED display device preferably employs a flexible base substrate 10 and the encapsulating layer 30 provided by the examples of this disclosure as well as an organic material functional layer 20 located therebetween so as to form a flexible OLED display device; and the curved-surface display characteristic the flexible OLED display device may provide a completely new visual experience for users.

On this basis, by adjusting the components of the organic coating layer 305 in the encapsulating layer 30, the OLED display device may be allowed to have properties such as anti-fogging property, low reflectivity, scratch resistance or the like, and thereby its application fields may be expanded while its display effect is improved.

Particularly, the components of the organic coating layer 305 and its effect which may be achieved can be seen the introduction of the portion of the encapsulating layer 30 provided by an embodiment of this disclosure, and verbose words are omitted herein.

The light emission manner of the OLED display device provided by an embodiment of this disclosure may be top emission or bottom emission, and of course may also be double-sided emission, which is not defined herein. Here, the top emission refers to a case where the direction of light emission departs from the side of the base substrate 10, the bottom emission refers to a case where the direction of light emission directs to the side of the base substrate 10, and the double-sided emission includes the above both cases.

Exemplarily, in the case where the OLED display device is a flexible top-emission type display device, the encapsulating layer 30 provided by an embodiment of this disclosure may effectively prevent moisture and oxygen in the atmospheric environment from entering the interior of the OLED display device so that the luminescent property of the flexible top-emission type display device may be improved and the useful life thereof is elongated.

An embodiment of this disclosure further provides a display apparatus, which comprises the electronic package device described above.

Here, the display apparatus may specifically include an apparatus having the display function, such as a display, a cell phone, a digital camera or the like, which is not specifically defined herein.

A specific embodiment is provided below to illustrate the production process of the OLED display device. With reference to the contents shown in FIG. 4, the OLED display device may comprise a flexible base substrate 10, a thin-film transistor 40 located on the flexible base substrate 10, an organic material functional layer 20 located on the thin-film transistor 40, an encapsulating barrier layer 304 located on the organic material functional layer 20, and an organic coating layer 305 located on the encapsulating barrier layer 304.

Figure 5:
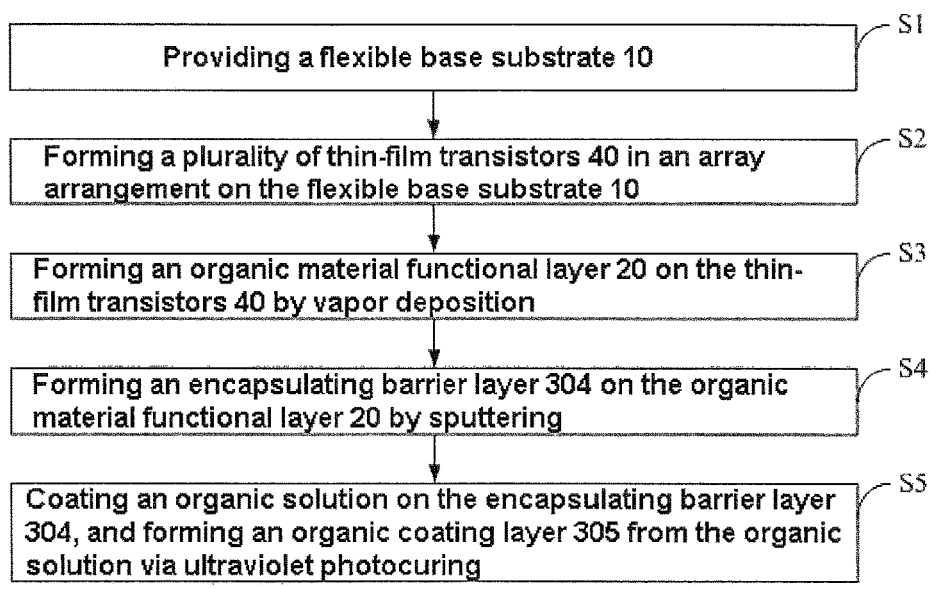
FIG. 5 is a production flow chart of an electronic package device (OLED display device) provided by an example of this disclosure.

Particularly, as shown in FIG. 5, the production process of the OLED display device may comprise the following steps of:

S1. Providing a flexible base substrate 10.

Here, the flexible base substrate 10 preferably employs a PI substrate, and the PI substrate has a thickness of about 10 nm.

S2. Forming a plurality of thin-film transistors 40 in an array arrangement on the flexible base substrate 10.

Here, the thin-film transistor may sequentially comprise a gate electrode, a gate insulating layer located on the gate electrode, a semiconductor active layer located on the gate insulating layer, and a source electrode and a drain electrode in the same layer located on the semiconductor active layer.

Here, the thin-film transistors 40 may constitute an active driving control layer of the OLED display device, and has a thickness of about 4 μm.

S3. Forming an organic material functional layer 20 on the thin-film transistors 40 by vapor deposition.

Here, the organic material functional layer 20 may specifically comprise red light emitting units, green light emitting units and a blue light emitting units, and the light emitting units may be in one-to-one correspondence with the thin-film transistors 40.

Here, the organic material functional layer 20 has a thickness of about 500 nm.

S4. Forming an encapsulating bather layer 304 on the organic material functional layer 20 by sputtering.

Here, the material of the encapsulating barrier layer 304 may employ an inorganic passivating material, for example silicon nitride, and the silicon nitride has a thickness of about 1 μm.

S5. Coating an organic solution on the encapsulating barrier layer 304, and forming an organic coating layer 305 from the organic solution via ultraviolet light curing.

Here, the means for applying the organic solution may include any one of spin coating, spray coating, blade coating, inkjet printing, and slit coating; and the formed organic coating layer 305 has a thickness which may be comparable to that of the PI substrate, i.e., about 10 μm.

Particularly, the organic coating layer 305 preferably employs the organic coating layer described above which has water-oxygen barrier property, low reflectivity, and scratch resistance at the same time.

Through the steps S1-S5 described above, a flexible OLED display device may be formed; and the flexible OLED display device not only has the characteristic of lightening and thinning, but also has good characteristics such as water-oxygen barrier property, anti-fogging property, low reflectivity, scratch resistance or the like, and effectively enhances the display effect of the OLED display device.

The above is only specific embodiments of this disclosure, but the scope of this disclosure is not limited thereto. Within the technical scope disclosed by this present disclosure, any person skilled in the art will easily conceive variations or replacements, which should be covered by the scope of this disclosure. Therefore, the protection scope of this disclosure is determined by the protection scope of the claims.

What is claimed is:

1. An encapsulating layer comprising an encapsulating barrier layer and an organic coating layer directly formed on the encapsulating barrier layer, wherein the organic coating layer is an unsaturated acrylate organic coating layer having a thickness of 2.5 µm-10 µm and is doped with hard particles; the hard particles including one or more of graphene oxide, transparent graphite, glass fiber, and diamond particles.

2. The encapsulating layer according to claim 1, wherein the unsaturated acrylate organic coating layer comprises a polyurethane acrylate organic coating layer or an epoxy acrylate organic coating layer.

3. The encapsulating layer according to claim 2, wherein the unsaturated acrylate organic coating layer is added with a cationic surfactant;
wherein the cationic surfactant comprises a hydrophilic quaternary ammonium salt.

4. The encapsulating layer according to claim 2, wherein the unsaturated acrylate organic coating layer comprises a first coating layer adjacent to the encapsulating barrier layer and a second coating layer away from the encapsulating barrier layer;
wherein the first coating layer has a refractive index greater than that of the second coating layer.

5. The encapsulating layer according to claim 4, wherein the first coating layer comprises one or more of a silane modified unsaturated acrylate polymer, an unsaturated polyurethane acrylate polymer, and an unsaturated fluorine-containing acrylate polymer.

6. The encapsulating layer according to claim 4, wherein the second coating layer comprises an unsaturated acrylate polymer doped with inorganic particles; the inorganic particles include one or more of titanium dioxide particles, titanium monoxide particles, zinc oxide particles, copper calcium titanate particles, and strontium titanate particles.

7. The encapsulating layer according to claim 1, wherein the encapsulating barrier layer comprises a plurality of overlapped encapsulating thin films.

8. The encapsulating layer according to claim 1, wherein the encapsulating barrier layer is a silicon nitride thin film or alternately deposited organic thin films and inorganic thin films.

9. The encapsulating layer according to claim 1, wherein the organic coating layer is an organic coating layer formed by forming an organic solution coating layer on the encapsulating barrier layer through spin coating, spray coating, blade coating, inkjet printing or slit coating, and then subjecting the organic solution coating layer to ultraviolet light curing, visible light curing, thermal curing, or chemical decomposition curing.

10. An electronic package device, comprising a base substrate and an encapsulating layer, as well as an electronic device located therebetween; wherein the encapsulating layer is the encapsulating layer according to claim 1.

11. The electronic package device according to claim 10, wherein the electronic package device is an OLED display device, and the electronic device is an organic material functional layer between the base substrate and the encapsulating layer;
and the encapsulating barrier layer of the encapsulating layer is adjacent to the base substrate, and the organic coating layer of the encapsulating layer is away from the base substrate.

12. The electronic package device according to claim 10, wherein the base substrate is a flexible base substrate;
and the flexible base substrate includes any one of a polyimide base substrate, a polyethylene base substrate, a polypropylene base substrate, a polystyrene base substrate, a polyethylene terephthalate base substrate, and a polyethylene naphthalate base substrate.

13. A display apparatus comprising an electronic package device according to claim 10.

* * * * *